United States Patent [19]

Rijns

[11] Patent Number: 5,570,048

[45] Date of Patent: Oct. 29, 1996

[54] SAMPLE-AND-HOLD CIRCUIT WITH REDUCED CLOCK FEEDTHROUGH

[75] Inventor: Johannes J. F. Rijns, Eindhoven, Netherlands

[73] Assignee: U.S. Philips Corporation, New York, N.Y.

[21] Appl. No.: 554,399

[22] Filed: Nov. 6, 1995

Related U.S. Application Data

[63] Continuation of Ser. No. 138,944, Oct. 18, 1993, abandoned.

[30] Foreign Application Priority Data

Oct. 19, 1992 [EP] European Pat. Off. ............. 92203190

[51] Int. Cl.$^6$ .................................................. G11C 27/02
[52] U.S. Cl. .................. 327/94; 327/95; 327/96; 327/337; 327/67
[58] Field of Search ................................. 307/352, 353, 307/359, 355, 364; 328/151; 327/91, 93, 94, 95, 96, 73, 67, 554, 337, 103, 382

[56] References Cited

U.S. PATENT DOCUMENTS

| | | | |
|---|---|---|---|
| 3,555,298 | 1/1971 | Neelands | 307/353 |
| 4,125,813 | 11/1978 | Cubbison, Jr. | 328/151 |
| 4,199,697 | 4/1980 | Edwards | 328/151 |
| 4,308,468 | 12/1981 | Olson | 327/94 |
| 4,352,070 | 9/1982 | Beaducel et al. | 328/151 |
| 4,517,518 | 5/1985 | Ishigaki | 327/94 |
| 4,520,283 | 5/1985 | Sasaki et al. | 328/151 |
| 5,162,670 | 11/1992 | Itakura et al. | 307/352 |
| 5,216,375 | 5/1993 | Tanigawa et al. | 327/335 |
| 5,258,664 | 11/1993 | White | 307/353 |

FOREIGN PATENT DOCUMENTS 55-8656 1/1980 Japan.

*Primary Examiner*—Timothy P. Callahan
*Assistant Examiner*—My-Trang Nu Ton

[57] ABSTRACT

A sample-and-hold circuit comprises a first buffer stage, a first sampling switch, a sampling capacitor, and a feedback output amplifier for supplying a sampled output signal (Uout). The sampling capacitor is connected to an output of a second buffer stage, which has an input connected to earth. The output amplifier receives feedback via a third buffer stage and a second sampling switch and via a fourth buffer stage and a second sampling capacitor, which together with the first sampling switch are controlled by the same clock signal. The first sampling switch gives rise to clock feedthrough at the non-inverting input of the output amplifier. This clock feedthrough is cancelled by an equal clock feedthrough at the inverting input, so that the sampled output signal is freed from undesired clock feedthrough.

3 Claims, 1 Drawing Sheet

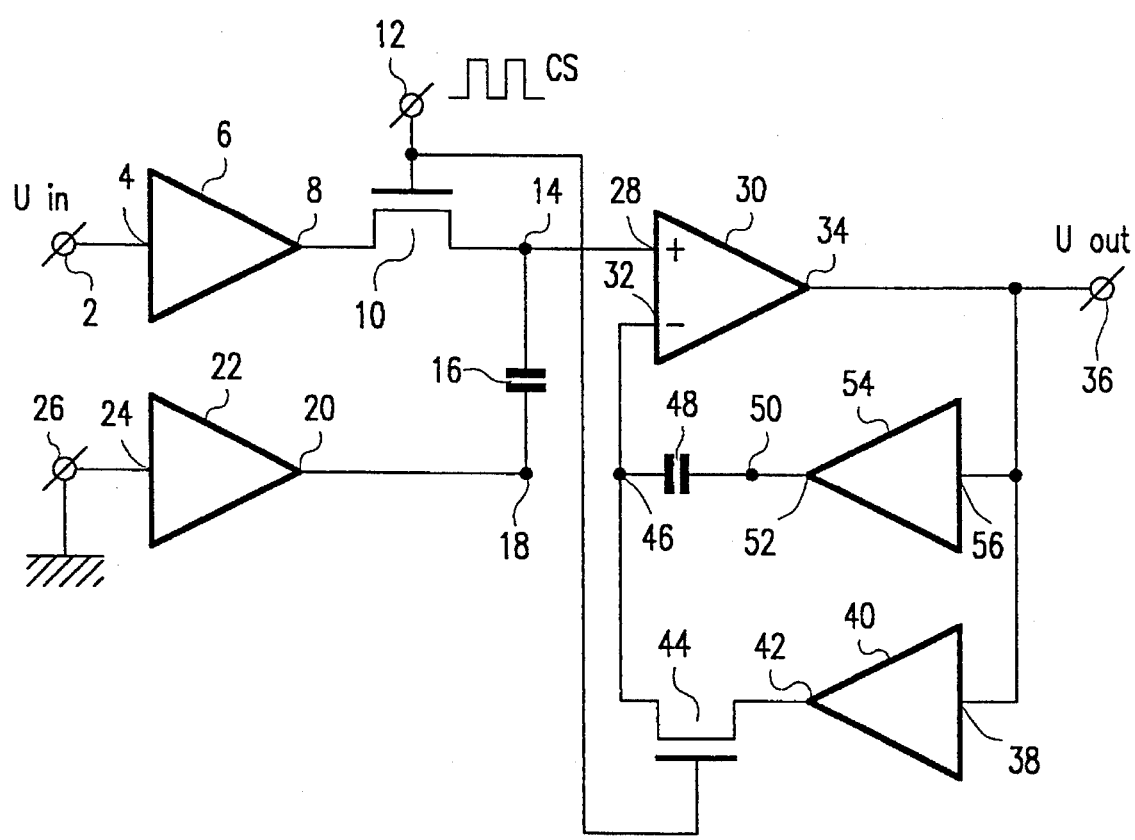

SAMPLE-AND-HOLD CIRCUIT WITH REDUCED CLOCK FEEDTHROUGH

This is a continuation application Ser. No. 08/138,944, filed Oct. 18, 1993, now abandoned.

BACKGROUND OF THE INVENTION

The invention relates to a sample-and-hold circuit comprising:

an input terminal for the application of an input signal to be sampled, a first buffer stage having an input coupled to the input terminal, and having an output, a first switching element having a control electrode coupled to a clock signal terminal for the application of a clock signal, having a first main electrode coupled to the output of the first buffer stage, and having a second main electrode, a first capacitive impedance having a first terminal coupled to the second main electrode of the first switching element, and having a second terminal coupled to a point of fixed potential, an output amplifier having a non-inverting input coupled to the first terminal of the first capacitive impedance, having an inverting input, and having an output coupled to an output terminal for supplying a sampled output signal, a second switching element having a control electrode coupled to the clock signal terminal, having a first main electrode coupled to the output of the output amplifier, and having a second main electrode coupled to the inverting input of the output amplifier, and a second capacitive impedance having a first terminal coupled to the second main electrode of the second switching element and having a second terminal coupled to the output of the output amplifier.

Sample-and-hold circuits, also referred to as track-and-hold circuits, are frequently used as interface circuits from the time-continuous domain to the time-discrete domain and vice versa. Examples can be found in analog-to-digital converters and digital-to-analog converters and in switched capacitor circuits.

A sample-and-hold circuit of the type defined in the opening paragraph is known inter alia from Japanese Kokai No. 55-8656(A). The input signal to be sampled is buffered by the first buffer stage, which charges the first capacitive impedance to the instantaneous value of the input signal when the first switch element is turned on. The output amplifier is arranged as a voltage follower and serves as a buffer between the first capacitive impedance and the output terminal. The output amplifier receives negative feedback by means of the second switching element and the second capacitive impedance, which are arranged in parallel between the output and the inverting input.

When the first switching element is conductive the output signal is a scaled replica of the input signal, the input signal being subjected to a filtering process which is dependent on the impedances of the first switching element and on the first capacitive impedance. When the first switching element is turned off charge carrriers are injected towards the impedances connected to the first and the second main electrode of the first switching element. This injection produces an undesired voltage step across the first capacitive impedance, which step also appears in the output signal. This effect is known as clock feedthrough. Said voltage step is counteracted by means of the second switching element and the second capacitive impedance in the negative-feedback path of the output amplifier. These elements produce a voltage step at the inverting input, which serves to compensate for the voltage step produced at the non-inverting input by the first semiconductor switch. However, this compensation is not perfect because the impedances connected to the first and second main electrodes of the first and the second switching element are not entirely equal to one another. Therefore, the attainable reduction of the clock feedthrough is liable to improvement.

SUMMARY OF THE INVENTION

It is an object of the invention to provide a sample-and-hold circuit having a clock feedthrough which is reduced even further. To achieve this, in accordance with the invention, the sample-and-hold circuit of the type defined in the opening paragraph is characterized in that the sample-and-hold circuit further comprises:

a second buffer stage having an input coupled to the point of fixed potential and having an output coupled to the second terminal of the first capacitive impedance, a third buffer stage having an input coupled to the output of the output amplifier, and having an output coupled to the first main electrode of the second switching element, and a fourth buffer stage having an input coupled to the output of the output amplifier, and having an output coupled to the second terminal of the second capacitive impedance.

By adding the second, the third and the fourth buffer stage it is achieved that the impedances connected to the first and the second switching element are substantially equal to one another. This results in an improved symmetry and a corresponding reduction of the clock feedthrough. An additional advantage of the chosen solution is that the buffers may be very simple and may even have an offset from input to output. The offsets will cancel one another owing to the symmetry of the circuit.

BRIEF DESCRIPTION OF THE DRAWINGS

These and other aspects of the invention will be described and elucidated with reference to the accompanying drawing, in which the single FIGURE shows a sample-and-hold circuit in accordance with the invention.

DETAILED DESCRIPTION OF THE PREFERRED EMBODIMENT

The Figure shows a sample-and-hold circuit in accordance with the invention. An input signal Uin to be sampled is applied to an input terminal 2, which is connected to an input 4 of a buffer stage 6 having an output 8 connected to a first main electrode of a switching element 10, which is for example a MOS transistor. The control electrode or gate of the switching element 10 is connected to a clock signal terminal 12, to which a clock signal CS is applied. A second main electrode of the switching element 10 is connected to a first terminal 14 of a capacitive impedance 16, which has a second terminal 18 connected to an output 20 of a buffer stage 22, which has an input 24 connected to a point 26 of fixed potential. In the present case the point 26 is connected to earth, so that in effect the terminal 18 of the capacitive impedance 16 is also connected to earth. Moreover, the terminal 14 is connected to a non-inverting input 28 of an output amplifier 30, which further has an inverting input 32 and an output 34, which output is connected to an output terminal 36 for supplying a sampled output signal Uout. The output 34 is connected to an input 38 of a buffer stage 40, which has an output 42 connected to a first main electrode of a switching element 44, for which again a MOS transistor has been selected. The control electrode or gate of the switching element 44 is also connected to the clock signal terminal 12, but separate control with another clock signal is also possible. The second main electrode of the switching element 44 is connected to the inverting input 32 of the output amplifier 30 and to a first terminal 46 of a capacitive impedance 48, which has a second terminal 50 connected to an output 52 of a buffer stage 54. The buffer stage 54 has an input 56 connected to the output 34 of the output amplifier 30.

The two switching elements 10 and 44 are energized from and loaded with equal impedances if the buffer stages 6, 22, 40 and 54 are identical and if the capacitive impedances 16 and 48 are identical. If the switching elements 10 and 44 are now also identical this will result in identical charge injections at the terminals 14 and 46 when these switches are turned off. The voltage step as a result of this charge injection appears both at the non-inverting input 28 and at the inverting input 32 of the output amplifier 30 and does not occur in the output signal Uout owing to the common-mode rejection of the output amplifier 30.

If the two switching elements 10 and 44 are conductive, i.e. in the sampling phase, the capacitive impedance 16 will be charged. The output amplifier 30 is arranged as a voltage follower via the buffer stage 40 and the switching element 44. In the hold phase both switching elements 10 and 44 are cut off. The output amplifier 30 then also operates as a follower because the voltage difference built up between the output 34 and the inverting input in the sampling phase is maintained constant by the buffer stage 54 and the capacitive impedance 48. During the change from the sampling phase to the hold phase the voltage steps appearing at the terminals 14 and 46 as a result of the charge injection cancel one another. Cancellation is achieved not only if all the buffer stages are identical to one another but also if the two buffer stages 6 and 40 are identical to each other and the two buffer stages 22 and 54 are identical to each other.

The capacitive impedances 16 and 48 are preferably capacitors but may also comprise a more complex impedance with a substantially capacitive behaviour. The switching elements 10 and 44 may be formed by PMOS or NMOS transistors or by a parallel arrangement of a PMOS and an NMOS transistor. Bipolar switching transistors are also possible because these transistors produce a similar charge injection as MOS transistors. In fact, any controllable switching element may be used. The balanced structure of the circuit will cancel the clock feedthrough produced by the switching elements.

If desired, very simple bipolar emitter followers or unipolar source followers may be used as buffer stages without this leading to an undesirable offset between the input terminal 2 and the output terminal 36. Indeed, the symmetry of the sample-and-hold circuit in accordance with the invention ensures that the offset between the base and emitter or between the gate and source of these simple buffer stages will be cancelled.

What is claimed is:

1. A sample-and-hold circuit comprising:

an input terminal for receiving of an input to be sampled, a first buffer having an input coupled to the input terminal, and having an output, a first switching element having a control electrode coupled to a clock signal terminal for receiving a clock signal, having a first main electrode coupled to the output of the first buffer, and having a second main electrode, a first capacitive impedance having a first terminal coupled to the second main electrode of the first switching element, and having a second terminal coupled to a point of fixed potential, an output amplifier having a non-inverting input coupled to the first terminal of the first capacitive impedance, having an inverting input, and having an output coupled to an output terminal for supplying a sampled output signal, a second switching element having a control electrode coupled to the clock signal terminal, having a first main electrode coupled to the output of the output amplifier, and having a second main electrode coupled to the inverting input of the output amplifier, a second capacitive impedance having a first terminal coupled to the second main electrode of the second switching element and having a second terminal coupled to the output of the output amplifier, a second buffer having an input coupled to the point of fixed potential and having an output coupled to the second terminal of the first capacitive impedance, a third buffer having an input coupled to the output of the output amplifier, and having an output coupled to the first main electrode of the second switching element, and a fourth buffer having an input coupled to the output of the output amplifier, and having an output coupled to the second terminal of the second capacitive impedance.

2. A sample-and-hold circuit as claimed in claim 1, wherein the first and the third buffers are substantially identical, the first and the second switching element are substantially identical, the first and the second capacitive impedance are substantially identical, and the second and the fourth buffers are substantially identical.

3. A sample-and-hold circuit as claimed in claim 2, wherein the first through the fourth buffers are substantially identical to one another.

* * * * *